US009513341B2

(12) United States Patent
Oohata

(10) Patent No.: US 9,513,341 B2
(45) Date of Patent: Dec. 6, 2016

(54) CURRENT DETECTION APPARATUS

(71) Applicant: Denso Corporation, Kariya, Aichi-pref. (JP)

(72) Inventor: Takuya Oohata, Chiryu (JP)

(73) Assignee: DENSO CORPORATION, Kariya (JP)

( * ) Notice: Subject to any disclaimer, the term of this patent is extended or adjusted under 35 U.S.C. 154(b) by 506 days.

(21) Appl. No.: 13/644,699

(22) Filed: Oct. 4, 2012

(65) Prior Publication Data
US 2013/0106425 A1    May 2, 2013

(30) Foreign Application Priority Data
Nov. 1, 2011    (JP) ................................. 2011-240260

(51) Int. Cl.
| | | |
|---|---|---|
| G01N 27/416 | (2006.01) | |
| G01R 31/36 | (2006.01) | |
| G01R 1/20 | (2006.01) | |
| H01M 10/48 | (2006.01) | |

(52) U.S. Cl.
CPC ........... *G01R 31/3696* (2013.01); *G01R 1/203* (2013.01); *H01M 10/48* (2013.01); *H01M 2220/20* (2013.01)

(58) Field of Classification Search
USPC ................................................ 324/426, 433
See application file for complete search history.

(56) References Cited

U.S. PATENT DOCUMENTS

2009/0039865 A1*   2/2009   Fernandez ...................... 324/72
2011/0187346 A1*   8/2011   Teramoto et al. ......... 324/76.11

FOREIGN PATENT DOCUMENTS

| CN | 101634688 A | 1/2010 |
|---|---|---|
| JP | A-2011-52998 | 3/2011 |

OTHER PUBLICATIONS

Nov. 3, 2014 Office Action issued in Chinese Application No. 201210418488.0.

* cited by examiner

*Primary Examiner* — Samuel Berhanu
(74) *Attorney, Agent, or Firm* — Oliff PLC

(57) ABSTRACT

A current detection apparatus for detecting a current from a battery flowing through a harness. The apparatus includes a resistor having first and second fixed portions secured and electrically connected to a battery-side wiring and the harness, respectively, a circuit board provided with a current detection circuit for detecting a current flowing through the resistor on the basis of a potential difference between two positions along a current carrying path between the first and second fixed portions of the resistor, and a casing for housing the resistor and the circuit board. The resistor includes a current carrying member that provides the current carrying path and a lead member electrically connecting the current carrying member and the circuit board. The first and second fixed portions, and the current carrying member are disposed on the top surface of the battery, and the circuit board is disposed on a side of the battery.

15 Claims, 8 Drawing Sheets

CURRENT DETECTION APPARATUS

CROSS-REFERENCE TO RELATED APPLICATION

This application is based on and claims the benefit of priority from earlier Japanese Patent Application No. 2011-240260 filed Nov. 1, 2011, the description of which is incorporated herein by reference.

BACKGROUND

1. (Technical Field)

The present invention relates to a current detection apparatus mounted in a vehicle, such as a passenger car or a truck, for detecting a charge or discharge current of a battery.

2. (Related Art)

A known current detection apparatus for detecting a current from a battery flowing through a harness, as disclosed in Japanese Patent Application Laid-Open Publication No. 2011-52998, includes a resistor having a first fixed portion at one end, which is secured and electrically connected to a battery-side wiring, and a second fixed portion at the other end, which is secured and electrically connected to the harness, and a casing for housing a circuit board and the resistor (save for the first and second fixed potions), which is disposed between the first and second fixed portions of the resistor and on a side of the battery.

In the recent automotive field, an increasing number of electronic devices mounted in an engine compartment reduce space in the engine compartment and/or space around the battery. In the disclosed apparatus, however, since the casing accommodating the resistor and the circuit board therein is disposed on a side of the battery, an obstacle on the side of the battery may prevent the casing from being disposed in place on the side of the battery. As a solution, the casing may be displaced along the side of the battery so as not to interfere with the obstacle. This solution, however, may not be desirable. This is because a positional relationship between the first fixed portion secured to the battery-side wiring and a portion of the resistor within the casing may be altered through the displacement and a resistance value of the resistor may thereby be changed, which may lead to significant redesign of the apparatus including redesign of the current detection circuit. Therefore, it is desirable to displace the casing accommodating the resistor and the circuit board therein along the side of the battery so as to avoid interference with the obstacle, without redesigning the current detection circuit.

In consideration of the foregoing, it would therefore be desirable to have a current detection apparatus capable of avoiding interference with an obstacle on a side of a battery without redesigning a current detection circuit.

SUMMARY

In accordance with an exemplary embodiment of the present invention, there is provided a current detection apparatus for detecting a current from a battery flowing through a harness. The apparatus includes: a resistor having a first fixed portion at one end and a second fixed portion at the other end, the first fixed portion being secured and electrically connected to a battery-side wiring and the second fixed portion being secured and electrically connected to the harness; a circuit board provided thereon with a current detection circuit for detecting a current flowing through the resistor on the basis of a potential difference between two positions along a current carrying path between the first and second fixed portions of the resistor; and a casing for housing the resistor and the circuit board. In the apparatus, the resistor comprises a current carrying member that provides the current carrying path between the first fixed portion and the second fixed portion and a lead member via which the potential difference between the two positions is acquired (by the current detection circuit). The first fixed portion, the second fixed portion, and the current carrying member are disposed on the top surface of the battery, and the circuit board is disposed on a side of the battery. The current carrying member is electrically connected to the circuit board through the lead member.

As above, the current carrying member is disposed on the top surface of the battery, and is electrically connected to the circuit board through the lead member. This allows the casing accommodating the circuit board therein to be displaced laterally or in a horizontal direction along the side of the battery (hereinafter also referred to as a board-mounting side), on which the circuit board is disposed, only by changing a length and/or a shape of the lead member, thereby avoiding interference with an obstacle on the board-mounting side of the battery. Since the displacement of the casing with the circuit board accommodated therein can be accomplished without changing a shape or the like of the current carrying member, a relationship between a potential difference between the two positions along the current carrying path and a current value is retained, and changes of the current detection circuit on the circuit board are not necessary. This can eliminate a need for significant redesign of the apparatus.

DESCRIPTION OF SPECIFIC EMBODIMENTS

The present inventions will be described more fully hereinafter with reference to the accompanying drawings. Like numbers refer to like elements throughout.

Figure 1:
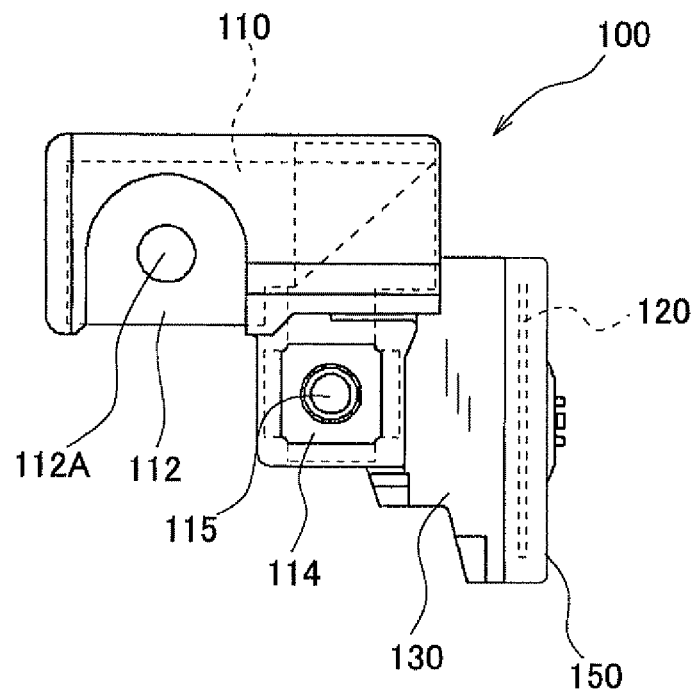
FIG. 1 is a top view of a current detection apparatus in accordance with one embodiment of the present invention.
Figure 2:
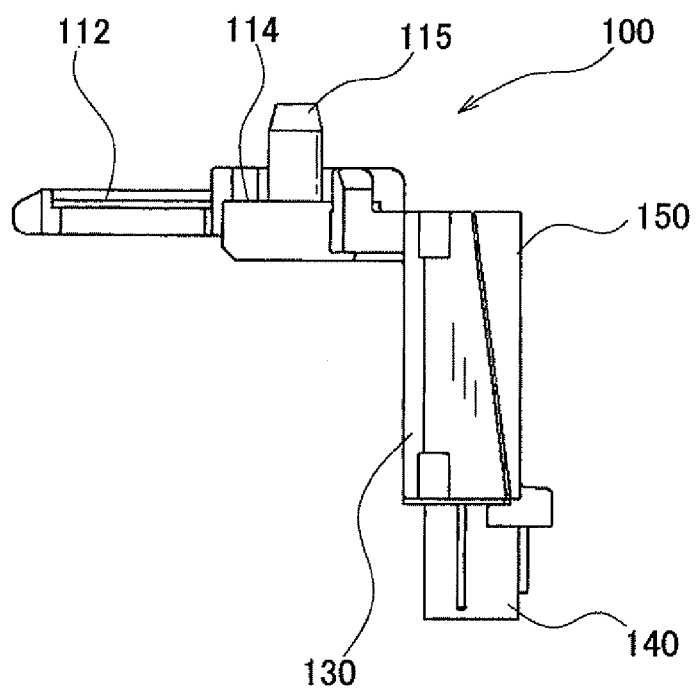
FIG. 2 is a side view of the current detection apparatus.
Figure 3:
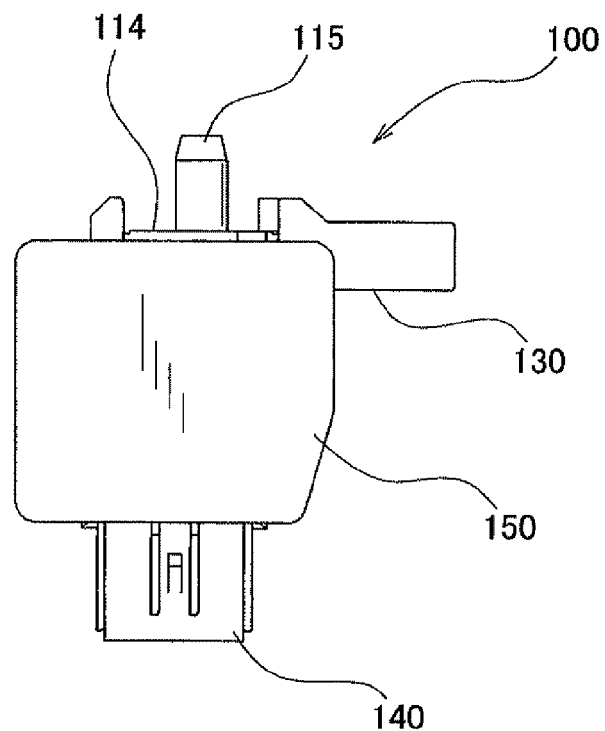
FIG. 3 is a side view of the current detection apparatus.

FIG. 1 is a top view of a current detection apparatus in accordance with one embodiment of the present invention. FIG. 2 is a side view of the current detection apparatus, taken from below in FIG. 1. FIG. 3 is a side view of the current detection apparatus, taken from the right of FIG. 1.

The current detection apparatus 100 of the present embodiment includes a bus bar 110 serving as a resistor (referred to as a shunt resistor) formed from a conductive material, a circuit board 120 provided thereon with a current detection circuit that detects a current flowing through the bus bar 110 on the basis of a potential difference between two positions along a current carrying path of the bus bar 110, a casing 130 housing the bus bar 110 and the circuit board 120, a connector 140 having a plurality of connector terminals exposed to the interior thereof for enabling electrical connection to the circuit board 120, and a cover 150 that closes an opening of a recessed portion of the casing 130 accommodating therein the circuit board 120.

The bus bar 110 has a twice-folded configuration within the casing 130, and includes a first fixed portion 112 at one end, which is secured and electrically connected to a battery-side wiring, and a second fixed portion 114 at the other end, which is secured and electrically connected to a harness 300. An upper surface of the first fixed portion 112 is coplanar with an upper surface of the second fixed portion 114. That is, the upper surface of the first fixed portion 112 is at the same level as the upper surface of the second fixed portion 114.

Figure 4:
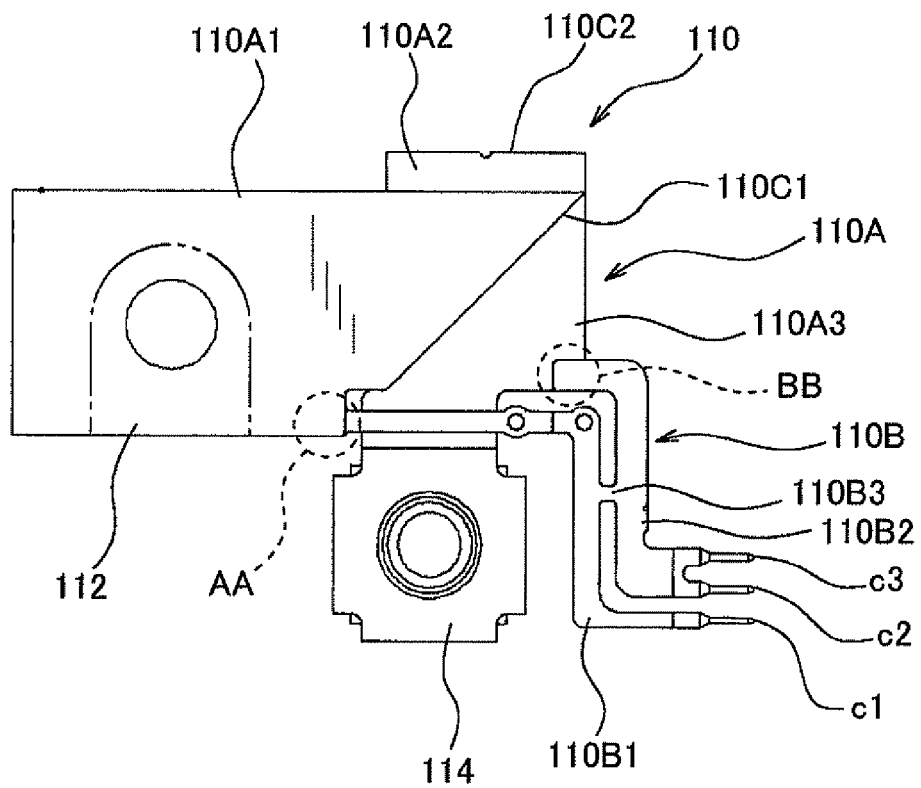
FIG. 4 is an expanded view of a bus bar of the current detection apparatus.
Figure 5:
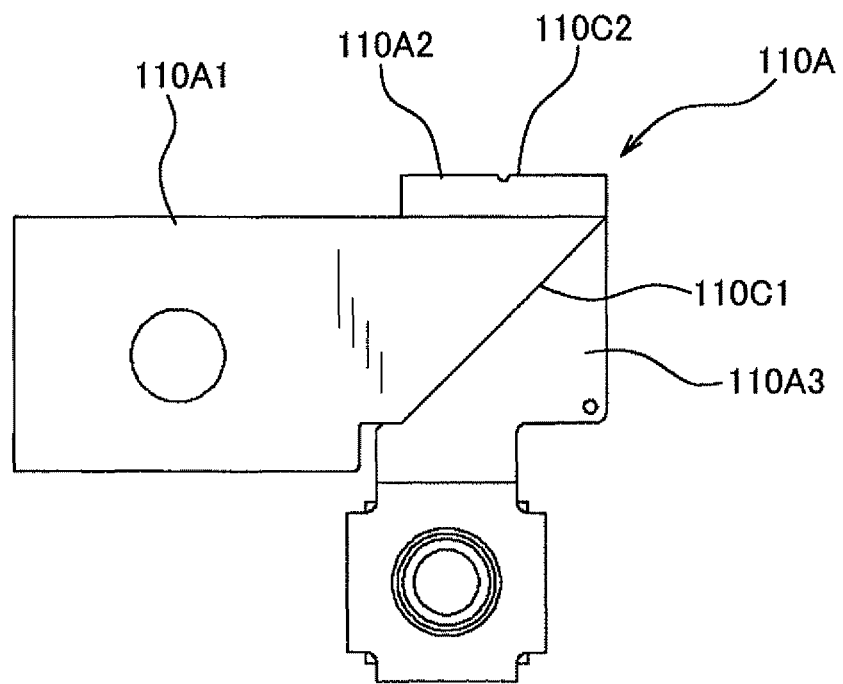
FIG. 5 is a top view of a current carrying member of the current detection apparatus.
Figure 6:
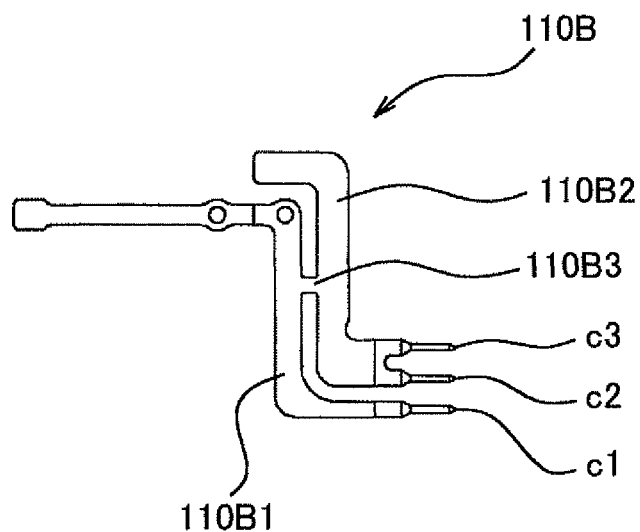
FIG. 6 is a top view of a lead member of the current detection apparatus.
Figure 7:
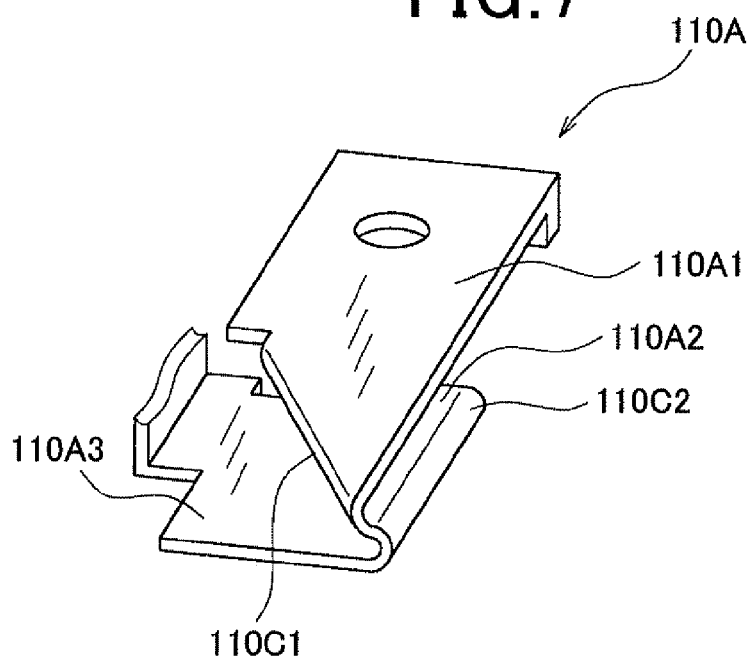
FIG. 7 is a perspective view of the current carrying member of the current detection apparatus.

FIG. 4 is an expanded view of the bus bar 110, where only the bus bar 110 is depicted for illustration purposes only. The bus bar 110 includes a current carrying member 110A through which a current flows between the first fixed portion 112 and the second fixed portion 114, and a lead member 110B via which a potential difference between two positions along the current carrying member 110A is acquired by the current detection circuit. FIG. 5 is a top view of the current carrying member 110A. FIG. 6 is a top view of the lead member 110B. FIG. 7 is a partial perspective view of the current carrying member 110A. In the present embodiment, the first fixed portion 112, the second fixed portion 114, and the current carrying member 110A are disposed on a top surface of the battery 200. The circuit board 120 is disposed on a side of the battery 200. The current carrying member 110A and the circuit board 120 are electrically connected to each other through the lead member 110B.

To define the current carrying member 110A, a straight elongated rectangular plate is folded twice in a direction perpendicular to the top surface of the battery 200. More specifically, the current carrying member 110A includes a first conductor panel (that is an upper conductor panel) 110A1 connected to the first fixed portion 112 and having a first fold 110C1 at one end, a second conductor panel 110A2 having one end joined with the first conductor panel 110A1 at the first fold 110C1 and an opposite end at a second fold 110C2, and a third conductor panel (that is a lower conductor panel) 110A3 having one end joined with the second conductor panel 110A2 at the second fold 110C2 and connected to the second fixed portion 114. Preferably, the extension direction of the first conductor panel 110A1 and the extension direction of the second conductor panel 110A2 are inclined at a first specific angle (90 degrees in the present embodiment as shown in FIG. 4) to each other. The extension direction of the second conductor panel 110A2 and the extension direction of the third conductor panel 110A3 are inclined at a second specific angle (180 degrees in the present embodiment as shown in FIG. 4) to each other.

The lead member 110B is used to electrically connect the current carrying member 110A and the circuit board 120. The current carrying member 110A and the lead member 110B are separate members, (as shown in FIGS. 5, 6). The lead member 110B is welded to the current carrying member 110A for establishing electrical and mechanical connection therebetween. As shown in FIG. 6, the lead member 110B includes a first lead conductor 110B1 and a second lead conductor 110B2 jointed together through a joining portion 110B3. The first lead conductor 110B1 and the second lead conductor 110B2 of the lead member 110B are kept joined together until welding of the lead member 110B to the current carrying member 110A is completed. The joining portion 110B3 is removed to disconnect the first lead conductor 110B1 and the second lead conductor 110B2 after completion of the welding.

One end of the first lead conductor 110B1 is welded to a lower-side surface of the first conductor panel 110A1 at a corner AA. One end of the second lead conductor 110B2 is welded to an upper-side surface of the third conductor panel 110A3 at a corner BB.

The first and second lead conductors 110B1, 110B2 extend from the corners AA, BB, respectively, toward a side of the battery 200 on which the circuit board 120 is mounted (hereinafter referred to as a board-mounting side of the battery 200). The first and second lead conductors 110B1, 110B2 further extend along the top surface of the battery 200 and in parallel with the board-mounting side of the battery 200, and still further extend in the same direction as their end portions at the respective corners AA, BB. It is possible to vary a length of each of the portions of the first and second lead conductors 110B1, 110B2 that extend along the top surface of the battery 200 and in parallel with the board-mounting side of the battery 200. This allows the casing 130 accommodating the circuit board 120 therein to be displaced laterally along the board-mounting side of the battery 200 without changing the positions of the corners AA, BB welded to the first and second lead conductors 110B1, 110B2, respectively. Therefore, a relationship between a current value and a potential difference between the corners AA, BB will not be affected by changing the above length, and no redesign of the current detection circuit will thus be required.

Figure 8:
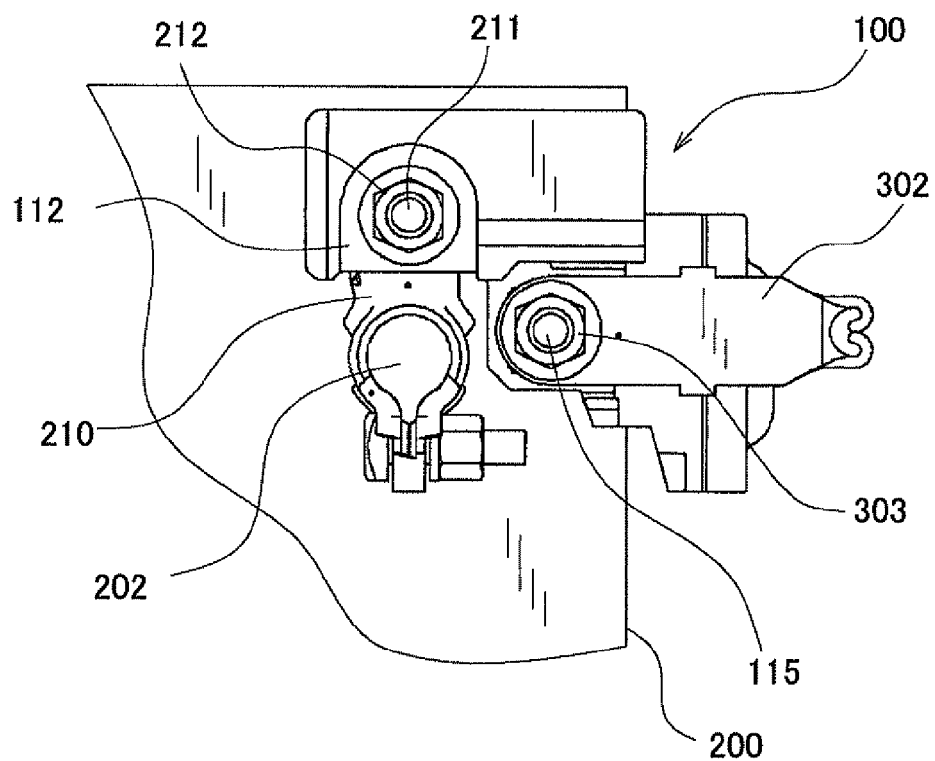
FIG. 8 is a top view illustrating a positional relationship between the current detection apparatus and a battery.
Figure 9:
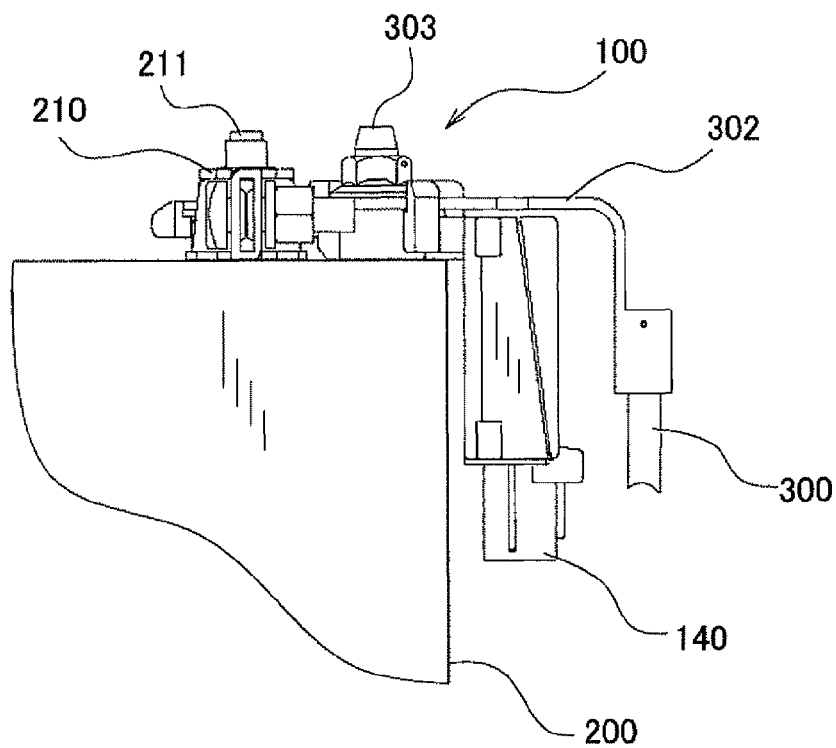
FIG. 9 is a side view illustrating a positional relationship between the current detection apparatus and the battery.

FIG. 8 is a top view illustrating a positional relationship between the current detection apparatus 100 and the battery 200, where the current detection apparatus 100 is mounted on the battery 200 and the harness 300 is secured to the battery 200 via its terminal 302. FIG. 9 is a side view illustrating a positional relationship between the current detection apparatus 100 and the battery 200. As shown in FIG. 8 and FIG. 9, the current detection apparatus 100 is secured and electrically connected to a negative terminal 202 of the battery 200 through a mounting bracket 210 (as a battery-side wiring) which serves as a wiring between the negative terminal 202 of the battery 200 and the first fixed portion 112, and a bolt 211 protrudes upwardly from an end portion of the mounting bracket 210. In the present embodiment, the bolt 211 passes through a first through hole 112A (shown in FIG. 1) arranged on the first fixed portion 112 and cooperates with a nut 212 to bring out the clamping action.

A second through hole is arranged on the second fixed portion 114, and a bolt 115 passes through this through hole. In addition, a third through hole is arranged on the terminal 302 of the harness 300. The bolt 115 further passes through the third through hole and cooperates with a nut 303 to bring out the clamping action, thereby securing and electrically connecting the terminal 302 of the harness 300 to the second fixed portion 114.

In the present embodiment, the casing 130 is formed of a resin material that has high thermal conductivity and electrical insulating ability, such as a polyphenylene sulfide (PPS) resin, and the whole bus bar 110, save for the first and second fixed portions 112, 114 exposed to the exterior, is insert-molded.

As described above, the bus bar 110 has a twice-folded, complicated configuration, and the two lead conductors 110B1, 110B2 for detecting a potential difference between the two spaced-apart corners AA, BB extend therefrom to the circuit board 120. The lead conductor 110B1 has a current detection terminal C1 at its end. The lead conductor 110B2 has two equal branches at its end. One branch is used as a sensing-dedicated ground terminal C2 and the other branch is used as a circuit-dedicated ground terminal C3. The circuit-dedicated ground terminal C3 is provided to minimize variations in electrical potential at the sensing-dedicated ground terminal C2 caused by operations of various circuits mounted on the circuit board 120. In the case of small variations in electrical potential at the sensing-dedicated ground terminal C2, the circuit-dedicated ground terminal C3 may be removed. Each of these three terminals (the current detection terminal C1, the sensing-dedicated ground terminal C2, the circuit-dedicated ground terminal C3) extending from the bus bar 110 passes through a respectively corresponding through hole arranged on the circuit board 120 and is soldered to the circuit board 120 so as to be electrically connected to the current detection circuit on the circuit board 120.

In general, the bus bar 110 through which a large current flows from the battery 200 has a significant heat capacity. Accordingly, when the three ends C1 to C3 of the lead member 110B extending from the current carrying member 110A are used to solder the bus bar 110 to the current detection circuit, insufficient heating may result in a soldering failure, such as poor solder rise. To facilitate inspection for such a soldering failure, it is desired that a soldered condition can be determined visually.

Figure 10:
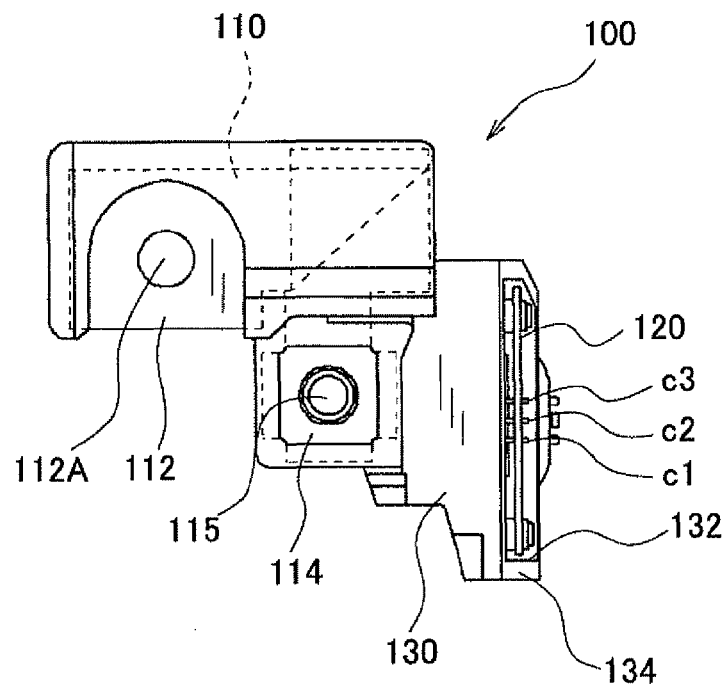
FIG. 10 is a top view of the current detection apparatus.
Figure 11:
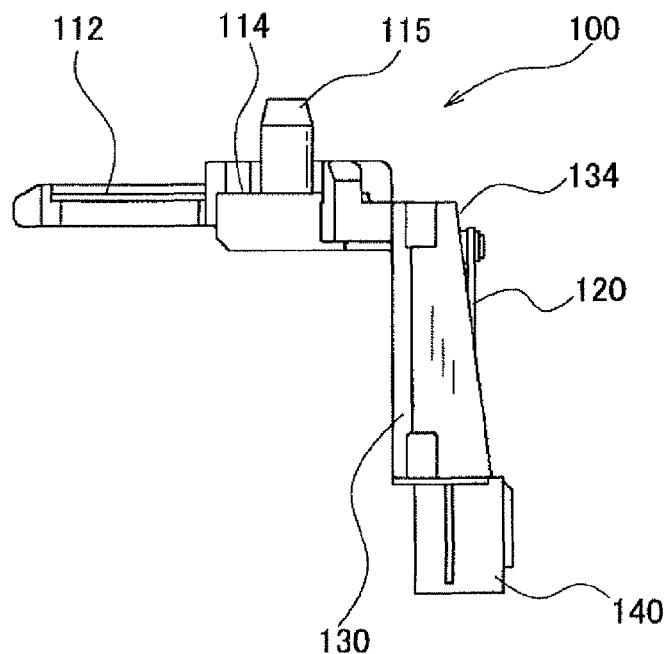
FIG. 11 is a side view of the current detection apparatus.
Figure 12A:
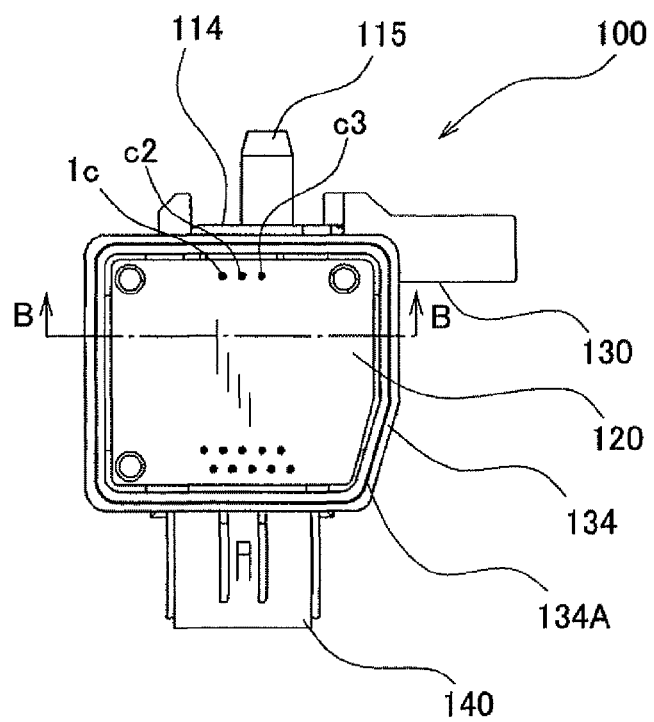
FIG. 12A is a side view of the current detection apparatus.

FIG. 10 is a top view of the current detection apparatus 100 with the cover 150 removed. FIG. 11 is a side view of the current detection apparatus 100, taken from below in FIG. 10. FIG. 12A is a side view of the current detection apparatus 100, taken from the right of FIG. 10.

As shown in FIG. 10, the three terminals (the current detection terminal C1, the sensing-dedicated ground terminal C2, and the circuit-dedicated ground terminal C3) extending from the current carrying member 110A of the bus bar 110 protrude from an inside bottom of the recessed portion 132 of the casing 130. The recessed portion 132 accommodates the circuit board 120 therein. Each of these three terminals passes through a respectively corresponding through hole arranged on the circuit board 120 and is soldered to the circuit board via the extremity of the terminal. The terminals C1 to C3 are positioned proximate one end of the circuit board 120 (proximate an upper end of the circuit board 120 as in FIG. 12A in the present embodiment).

An open end 134 of the recessed portion 132 that can be engaged with the cover 150 (hereinafter also referred to as an engagement section of the recessed portion 132) is lying in an imaginary plane that is non-parallel to the circuit board 120, i.e., the front-side or rear-side surface of the circuit board 120. More specifically, as shown in FIG. 11, the plane is tilted relative to the circuit board 120 so that a depth D of the recessed portion 132 (a width of a side wall of the recessed portion 132 as shown in FIG. 11) decreases monotonically in an upward direction of the casing 130 with the depth D being kept constant in a lateral direction of the casing 130 so that an upper end portion of the circuit board 120 including three solder junctions, each of which is a solder junction between the circuit board 120 and one of the three terminals C1 to C3, lies outside of the recessed portion 132. That is, both the front-side and rear-side surfaces of the upper end portion of the circuit board 120 are visible from the exterior when the cover 150 is removed. This configuration allows a soldered condition of each of the three solder junctions to be readily determined visibly from both sides of the circuit board 120.

Figure 12B:
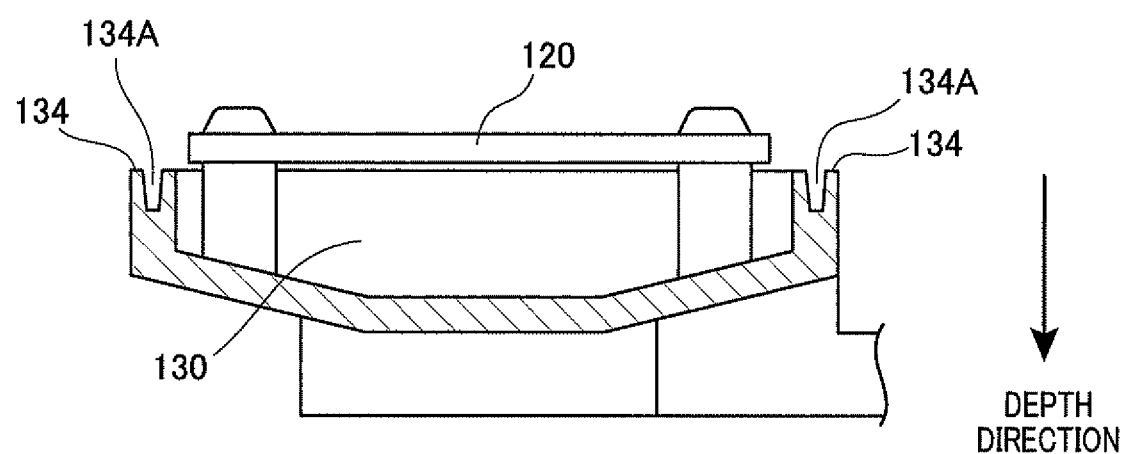
FIG. 12B is a partial cross-sectional view of FIG. 12A along line B-B.
Figure 12C:
FIG. 12C is a cross-sectional view of a cover that can be engaged with the casing of FIG. 12B.

In addition, as shown in FIG. 12A, the engagement section 134 includes a groove 134A surrounding the opening of the recessed portion 132, a depth direction of which is perpendicular to the plane as can be seen in FIG. 12B, and the cover 150 includes a protrusion 134B at its open end 135 as shown in FIG. 12C, which is arranged on the cover 150 so as to be circumferentially engaged with the groove 134A so that the opening of the recessed portion 132 can be closed by the cover 150 to form an enclosure. At the time of assembling the cover 150 with the casing 130, the cover 150 is adhered to the casing 130 by applying adhesive to the groove 134A with the engagement section 134 kept horizontal by inclining the current detection apparatus 100 accordingly. Alternatively, the engagement section 134 may include a protrusion surrounding the opening of the recessed portion 132 and the cover 150 may include a groove arranged at the open end of the cover 150 to be circumferentially engaged with the protrusion of the recessed portion 132 so that the opening of the recessed portion 132 can be closed by the cover 150 to form an enclosure. Still alternatively, the cover 150 may be adhered to the casing 130 using neither the groove nor the protrusion.

Figure 13:
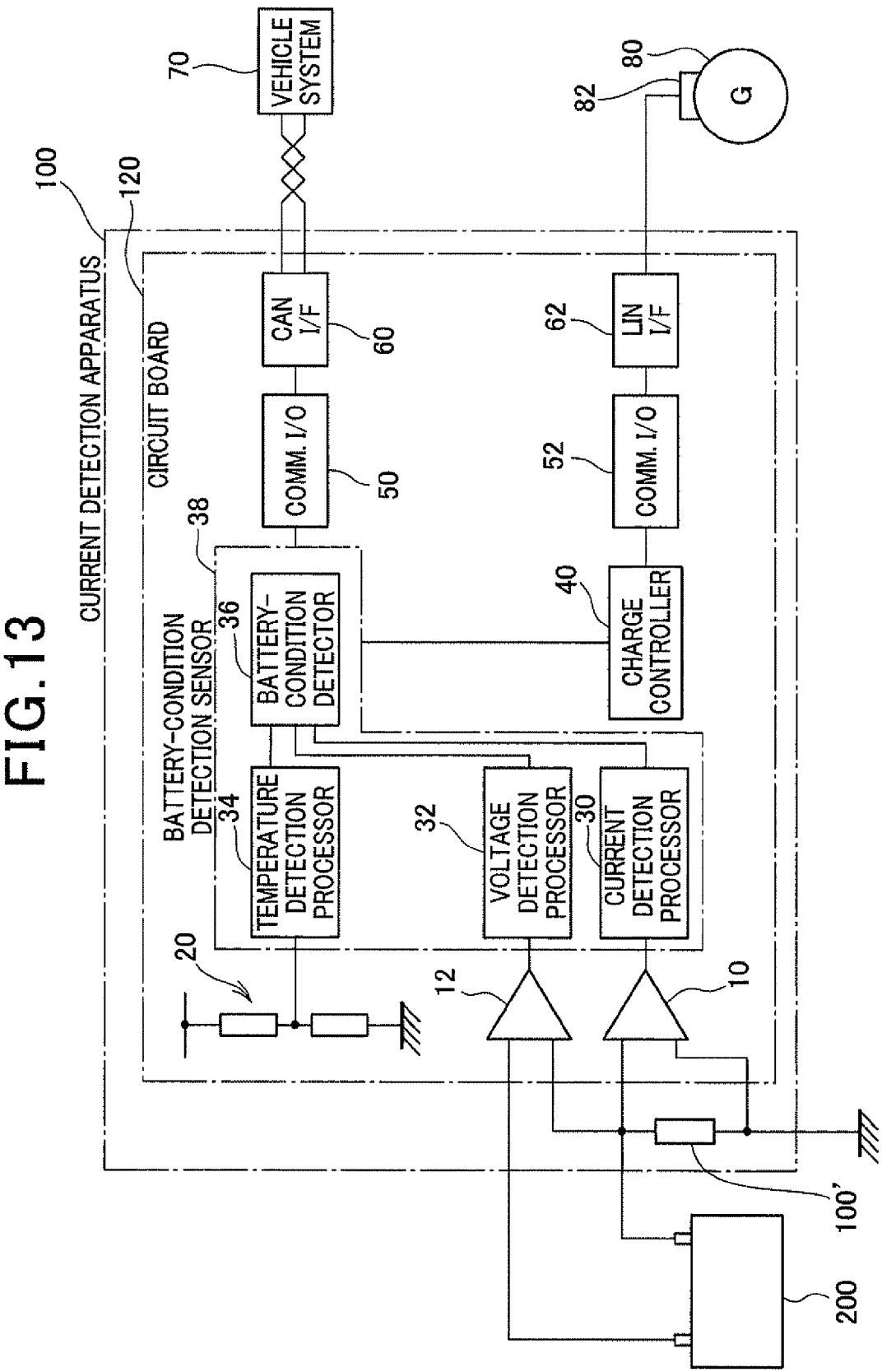
FIG. 13 is a block diagram of the current detection apparatus and the battery electrically connected thereto.

FIG. 13 is an exemplary block diagram of the current detection apparatus 100 and the battery 200 electrically connected thereto. As shown in FIG. 13, the circuit board 120 of the current detection apparatus 100 includes a differential amplifier 10 electrically connected across a shunt resistor 100' that is a portion of the bus bar 110, a differential amplifier 12 electrically connected between positive and negative terminals of the battery 200, a temperature detector 20, a current detection processor 30, a voltage detection processor 32, a temperature detection processor 34, a battery-condition detector 36, a charge controller 40, a communication input/output unit (communication I/O) 50, 52, a CAN-interface (CAN I/F) 60 that transmits and receives data according to the CAN protocol, a LIN-interface (LIN I/F) 62 that transmits and receives data according to the LIN protocol. The differential amplifier 10 amplifies a voltage across the shunt resistor 100', and the current detection processor 30 detects a current flowing through the shunt resistor 100' on the basis of an output voltage of the differential amplifier 10. The current detection circuit includes the differential amplifier 10 and the current detection processor 30. The differential amplifier 12 converts a voltage across the battery 200 (referred to as a battery voltage) into a proper level of voltage, and the voltage detection processor 32 detects the battery voltage on the basis of an output voltage of the differential amplifier 12. The temperature detector 20 includes a voltage-dividing circuit formed of a resistor and a thermistor, where a resistance value of the thermistor varies as a function of a temperature and a divided voltage of the voltage-dividing circuit varies accordingly. The temperature detection processor 34 detects a temperature of the current detection apparatus 100 (i.e., a temperature of the battery 200) on the basis of an output voltage (a divided voltage) of the temperature detector 20. The battery-condition detector 36 generates a battery condition signal on the basis of a detection value of each of the current detection processor 30, the voltage detection processor 32, the temperature detection processor 34. A battery-condition detection sensor 38 includes the current detection processor 30, the voltage detection processor 32, the temperature detection processor 34, the battery-condition detector 36. The charge controller 40 controls a power generation state of a vehicle generator (G) 80 on the basis of the battery condition signal generated by the battery-condition detector 36. The power generation control is performed by transmitting an instruction to a power-generation controller 82 mounted on the vehicle generator 80 via the communication input/output unit 52 and the LIN-interface 62. The battery condition signal generated by the battery-condition detector 36 is transmitted to the vehicle system 70 via the communication input/output unit 50 and the CAN-interface 60. The vehicle system 70 integrally controls an engine and various electrical loads on the basis of the received battery condition signal and the like.

As described above, in the current detection apparatus 100 of the present embodiment, the current carrying member 110A is disposed on the top surface of the battery 200, and the current carrying member 110A is electrically connected to the circuit board 120 through the lead member 110B. This allows the casing 130 accommodating the circuit board 120 therein to be displaced laterally along the board-mounting side of the battery 200 only by changing a length and/or a shape of the lead member 110B so as to avoid interference with an obstacle on a board-mounting side of the battery 200. Since the displacement of the circuit board 120 within the casing 130 can be accomplished without changing a shape or the like of the current carrying member 110A, a relationship between a potential difference between two positions along the current carrying path of the bus bar 110 and a current value is retained, and changes of the current detection circuit on the circuit board 120 are not necessary. This can eliminate a need for significant redesign of the apparatus.

In addition, in the above described embodiment, a straight elongated rectangular plate is folded twice in a direction perpendicular to the top surface of the battery 200 to define the current carrying member 110A. This can reduce a distance between the first fixed portion 112 and the second fixed portion 114 to thereby reduce stress applied to the first fixed portion 112 when the harness 300 is secured to the second fixed portion 114, which makes it possible to avoid loosening or deformation of the first fixed portion 112.

In addition, in the above described embodiment, the current carrying member 110A and the lead member 110B are separate members, and the first lead conductor 110B1 and the second lead conductor 110B2 are jointed together through the joining portion 110B3 to form the lead member 110B. The first lead conductor 110B1 and the second lead conductor 110B2 of the lead member 110B are kept joined together until welding of the lead member 110B to the current carrying member 110A is completed. The joining portion 110B3 is removed to disconnect the first lead conductor 110B1 and the second lead conductor 110B2 after completion of the welding. This facilitates fixing the lead member 110B when the lead member 110B is welded to the current carrying member 110A. With this configuration, a position of the first lead conductor 110B1 relative to the second lead conductor 110B2 can be fixed, which leads to enhancement of placement accuracy when the lead member 110B is welded to the current carrying member 110A.

In addition, in the above described embodiment, one end of the first lead conductor 110B1 is welded to a lower-side surface of the first conductor panel 110A1, and one end of the second lead conductor 110B2 is welded to an upper-side surface of the third conductor panel 110A3. This can prevent the lead member 110B from projecting outwardly of the current carrying member 110A, and reduce an amount of resin required to resin-mold the casing 130, which enables downsizing of the current detection apparatus 100.

There will now be explained some modifications of the above described embodiment that may be devised without departing from the spirit and scope of the present invention. In the above described embodiment, the bus bar 110 serves as the shunt resistor. Alternatively, the bus bar 110 and the shunt resistor are separate members.

In the above described embodiment, the current detection apparatus 100 is secured and electrically connected to the negative terminal 202 of the battery 200 through the mounting bracket 210. Alternatively, the current detection apparatus 100 may be secured directly to the negative terminal 202 of the battery 200 by deforming the first fixed portion 112 so as to extend to the negative terminal 202.

In the above described embodiment, the current carrying member 110A of the bus bar 110 has the twice-folded configuration, which is formed by folding a straight elongated rectangular plate twice. Alternatively, the current carrying member 110A of the bus bar 110 may be formed by folding a straight elongated rectangular plate once or more than twice or by folding a non-straight elongated plate once or more or without folding the plate.

APPLICABILITY

As described above, in the current detection apparatus 100 of the present embodiment, the current carrying member 110A is disposed on the top surface of the battery 200, and the current carrying member 110A is electrically connected to the circuit board 120 through the lead member 110B. This allows the casing 130 accommodating the circuit board 120 therein to be displaced laterally along the board-mounting side of the battery 200 only by changing a length and/or a shape of the lead member 110B so as to avoid interference with an obstacle on a board-mounting side of the battery 200.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A current detection apparatus for detecting a current from a battery flowing through a harness, comprising:
   a resistor having a first fixed portion at one end and a second fixed portion at the other end, the first fixed portion being secured and electrically connected to a battery-side wiring and the second fixed portion being secured and electrically connected to the harness;
   a circuit board provided thereon with a current detection circuit for detecting a current flowing through the resistor on the basis of a potential difference between two positions along a current carrying path between the first and second fixed portions of the resistor; and a casing for housing the resistor and the circuit board, wherein the resistor comprises a current carrying member that provides the current carrying path between the first fixed portion and the second fixed portion and a lead member via which the potential difference between the two positions is acquired, the first fixed portion, the second fixed portion, and an entirety of the current carrying member are disposed on the top surface of the battery, and the circuit board is disposed on a side of the battery, the current carrying member is electrically connected to the circuit board through the lead member, the current carrying member and the lead member are separate members, and the lead member comprises a first lead conductor and a second lead conductor, the first lead conductor electrically connecting the first fixed portion of the current carrying member and the circuit board, the second lead conductor electrically connecting the second fixed portion of the current carrying member and the circuit board, each of the first and second lead conductors including at least a portion extending along the top surface of the battery and in parallel with the side of the battery, the current carrying member is formed by folding the conductor plate twice in a direction perpendicular to the top surface of the battery, the conductor plate comprising a straight elongated rectangular plate, the current carrying member includes a first conductor panel connected to the first fixed portion and having a first fold at one end, a second conductor panel having one end joined with the first conductor panel at the first fold and an opposite end at the second fold, and a third conductor panel having one end joined with the second conductor panel at the second fold and connected to the second fixed portion at the other end, the extension direction of the first conductor panel and the extension direction of the second conductor panel are inclined at a first specific angle to each other, and the extension direction of the second conductor panel and the extension direction of the third conductor panel are inclined at a second specific angle to each other.

2. The apparatus of claim 1, wherein the first specific angle is 90 degrees and the second specific angle is 180 degrees.

3. The apparatus of claim 1, wherein one end portion of the first lead conductor is welded to a lower-side surface of the first conductor panel of the current carrying member, and one end portion of the second lead conductor is welded to an upper-side surface of the third conductor panel of the current carrying member.

4. The apparatus of claim 3, wherein the two positions along the current carrying path comprises a first position at which the first lead conductor is welded to the first conductor panel of the current carrying member, and a second position at which the second lead conductor is welded to the third conductor panel of the current carrying member.

5. A current detection apparatus for detecting a current from a battery flowing through a harness, comprising:

a resistor having a first fixed portion at one end and a second fixed portion at the other end, the first fixed portion being secured and electrically connected to a battery-side wiring and the second fixed portion being secured and electrically connected to the harness;

a circuit board provided thereon with a current detection circuit for detecting a current flowing through the resistor on the basis of a potential difference between two positions along a current carrying path between the first and second fixed portions of the resistor; and a casing for housing the resistor and the circuit board, wherein the resistor comprises a current carrying member that provides the current carrying path between the first fixed portion and the second fixed portion and a lead member via which the potential difference between the two positions is acquired, the first fixed portion, the second fixed portion, and an entirety of the current carrying member are disposed on the top surface of the battery, and the circuit board is disposed on a side of the battery, the current carrying member is electrically connected to the circuit board through the lead member, the current carrying member is formed by folding a conductor plate twice in a direction perpendicular to the top surface of the battery, the current carrying member includes a first conductor panel connected to the first fixed portion and having a first fold at one end, a second conductor panel having one end joined with the first conductor panel at the first fold and an opposite end at a second fold, and a third conductor panel having one end joined with the second conductor panel at the second fold and connected to the second fixed portion at the other end, the extension direction of the first conductor panel and the extension direction of the second conductor panel are inclined at a first specific angle to each other, and the extension direction of the second conductor panel and the extension direction of the third conductor panel are inclined at a second specific angle to each other.

6. The apparatus of claim 5, wherein the plate comprises a straight elongated rectangular plate.

7. The apparatus of claim 5, wherein the first specific angle is 90 degrees and the second specific angle is 180 degrees.

8. The apparatus of claim 5, wherein one end portion of the first lead conductor is welded to a lower-side surface of the first conductor panel of the current carrying member, and one end portion of the second lead conductor is welded to an upper-side surface of the third conductor panel of the current carrying member.

9. The apparatus of claim 8, wherein the two positions along the current carrying path comprises a first position at which the first lead conductor is welded to the first conductor panel of the current carrying member, and a second position at which the second lead conductor is welded to the third conductor panel of the current carrying member.

10. A current detection apparatus for detecting a current from a battery flowing through a harness, comprising:

a bus bar having a first fixed portion at one end and a second fixed portion at the other end, the first fixed portion being secured and electrically connected to a battery-side wiring and the second fixed portion being secured and electrically connected to the harness;

a circuit board provided thereon with a current detection circuit for detecting a current flowing through the bus bar on the basis of a potential difference between two positions along a current carrying path between the first and second fixed portions of the bus bar; and a casing for housing the bus bar and the circuit board, wherein the bus bar comprises a current carrying member that provides the current carrying path between the first fixed portion and the second fixed portion and a lead member via which the potential difference between the two positions is acquired, the first fixed portion, the second fixed portion, and the current carrying member are disposed on the top surface of the battery, and the circuit board is disposed on a side of the battery, the current carrying member is electrically connected to the circuit board through the lead member, the current carrying member is formed by folding a conductor plate twice in a direction perpendicular to the top surface of the battery, the conductor plate comprising a straight elongated rectangular plate, the current carrying member includes a first conductor panel connected to the first fixed portion and having a first fold at one end, a second conductor panel having one end joined with the first conductor panel at the first fold and an opposite end at a second fold, and a third conductor panel having one end joined with the second conductor panel at the second fold and connected to the second fixed portion at the other end.

11. The apparatus of claim 10, wherein the extension direction of the first conductor panel and the extension direction of the second conductor panel are inclined at a first specific angle to each other, and the extension direction of the second conductor panel and the extension direction of the third conductor panel are inclined at a second specific angle to each other.

12. The apparatus of claim 11, wherein the first specific angle is 90 degrees and the second specific angle is 180 degrees.

13. The apparatus of claim 10, wherein one end portion of the first lead conductor is welded to a lower-side surface of the first conductor panel of the current carrying member, and one end portion of the second lead conductor is welded to an upper-side surface of the third conductor panel of the current carrying member.

14. The apparatus of claim 13, wherein the two positions along the current carrying path comprises a first position at which the first lead conductor is welded to the first conductor panel of the current carrying member, and a second position at which the second lead conductor is welded to the third conductor panel of the current carrying member.

15. The apparatus of claim 10, wherein the current carrying member and the lead member are separate members, and the lead member comprises a first lead conductor and a second lead conductor, the first lead conductor electrically connecting the first fixed portion of the current carrying member and the circuit board, the second lead conductor electrically connecting the second fixed portion of the current carrying member and the circuit board, each of the first and second lead conductors including at least a portion extending along the top surface of the battery and in parallel with the side of the battery.

* * * * *